United States Patent
Utsumi

(10) Patent No.: US 9,370,793 B2
(45) Date of Patent: Jun. 21, 2016

(54) COMPONENT MOUNTING DEVICE

(71) Applicant: YAMAHA HATSUDOKI KABUSHIKI KAISHA, Shizuoka-ken (JP)

(72) Inventor: Tomoyoshi Utsumi, Shizuoka-ken (JP)

(73) Assignee: YAMAHA HATSUDOKI KABUSHIKI KAISHA, Shizuoka-ken (JP)

(*) Notice: Subject to any disclaimer, the term of this patent is extended or adjusted under 35 U.S.C. 154(b) by 229 days.

(21) Appl. No.: 14/370,621

(22) PCT Filed: Dec. 11, 2012

(86) PCT No.: PCT/JP2012/007891
§ 371 (c)(1),
(2) Date: Jul. 3, 2014

(87) PCT Pub. No.: WO2013/105175
PCT Pub. Date: Jul. 18, 2013

(65) Prior Publication Data
US 2015/0041557 A1 Feb. 12, 2015

(30) Foreign Application Priority Data
Jan. 11, 2012 (JP) .................. 2012-003190

(51) Int. Cl.
H02K 41/02 (2006.01)
B05B 15/06 (2006.01)
(Continued)

(52) U.S. Cl.
CPC .......... B05B 15/061 (2013.01); B05B 3/00 (2013.01); H02K 41/031 (2013.01); H05K 13/0413 (2013.01); H02K 2201/18 (2013.01)

(58) Field of Classification Search
None
See application file for complete search history.

(56) References Cited

U.S. PATENT DOCUMENTS

2003/0116339 A1  6/2003  Suhara
2009/0056114 A1  3/2009  Kanai et al.
(Continued)

FOREIGN PATENT DOCUMENTS

CN   1371852 A    10/2002
EP   2234252 A1   9/2010
(Continued)

OTHER PUBLICATIONS

The extended European search report issued by the European Patent Office on Jul. 22, 2015, which corresponds to European Patent Application No. 12864919.1-1905 and is related to U.S. Appl. No. 14/370,621.

(Continued)

Primary Examiner — Erica Lin
(74) Attorney, Agent, or Firm — Studebaker & Brackett PC

(57) ABSTRACT

A component mounting device is provided with a head unit having a first nozzle array including a plurality of nozzle members aligned in a first direction, a second nozzle array that includes a plurality of nozzle members aligned in the first direction and that is aligned in a second direction orthogonal to the first direction. A first linear motor vertically drives the nozzle members of the first nozzle array. A second linear motor drives the nozzle members of the second nozzle array. Each linear motor includes a linear motor main body that includes a stationary element and a mobile element that faces the stationary element in the second direction. The mobile element of the first linear motor and the mobile element of the second linear motor are in close proximity with each other in the second direction and each stationary element is located outside the mobile element.

4 Claims, 7 Drawing Sheets

(51) Int. Cl.
*H02K 41/03* (2006.01)
*H05K 13/04* (2006.01)
*B05B 3/00* (2006.01)

(56) References Cited

U.S. PATENT DOCUMENTS

| | | |
|---|---|---|
| 2010/0289345 A1 | 11/2010 | Sakai et al. |
| 2011/0025137 A1* | 2/2011 | Sakai ............... H02K 41/02 310/12.13 |
| 2011/0052348 A1* | 3/2011 | Hanamura ......... H02K 16/00 414/225.01 |
| 2014/0175910 A1 | 6/2014 | Hanamura et al. |

FOREIGN PATENT DOCUMENTS

| | | |
|---|---|---|
| EP | 2242169 A1 | 10/2010 |
| JP | 2003-046295 A | 2/2003 |
| JP | 2006-180645 A | 7/2006 |
| JP | 4208155 B2 | 1/2009 |
| JP | 2009-171660 A | 7/2009 |
| JP | 2009-171683 A | 7/2009 |
| JP | 2010-016115 A | 1/2010 |
| WO | 2006/068322 A1 | 6/2006 |

OTHER PUBLICATIONS

International Search Report; PCT/JP2012/007891; Jan. 22, 2013.

* cited by examiner

COMPONENT MOUNTING DEVICE

CROSS REFERENCE TO RELATED APPLICATIONS

This applications claims benefit of priority to Japanese Patent Application No. 2012-003190 filed Jan. 11, 2012, and to International Patent Application No. PCT/JP2012/007891 filed on Dec. 11, 2012, the entire content of each of which are incorporated herein by reference.

TECHNICAL FIELD

The present technical field relates to a component mounting device in which a component is taken out from a component supply section and mounted in a mounting position on a substrate.

BACKGROUND

Conventionally, a component mounting device has been known in which a component is taken out from a component supply section and mounted in a mounting position on a substrate by a head provided with a vertically-movable shaft member (hereinafter referred to as a nozzle member) having a nozzle for component mounting. In component mounting devices in recent years, there is a trend that a head unit is mounted with a plurality of nozzle members in order to improve efficiency of mounting operations. For example, Japanese Patent No. 4208155 describes a component mounting device in which a plurality of nozzle members are mounted to a head unit in a state of being arranged in two front and rear rows. In the component mounting device described in Japanese Patent No. 4208155, the respective nozzle members are each coupled to a mobile element of a shaft-type linear motor, and the respective nozzle members are vertically driven by the shaft-type linear motor. With such a configuration in which the nozzle member is vertically driven by the shaft-type linear motor, the space occupied by a driving mechanism for vertically moving the nozzle member can be reduced compared to a configuration in which a nozzle member is vertically driven by a screw feed mechanism or the like with a rotary motor as a drive source, and it is advantageous in narrowing the pitch of arrangement of the nozzle members or reducing the size of the head unit.

However, since the shaft-type linear motor is a so-called coreless linear motor in which an armature is not provided with a core, the generated drive force (thrust of the nozzle member) is relatively small. Therefore, for example, if the nozzle member is to be driven at a higher speed in order to increase the mounting efficiency, an increase in size of the armature (coil), i.e., an increase in size of the shaft-type linear motor, is necessary, and narrowing of the pitch of arrangement of the nozzle members or size reduction of the head unit is hindered.

SUMMARY

An object of the present disclosure is to provide a technique that contributes to narrowing of the pitch of arrangement of nozzle members or size reduction of a head unit while enabling the nozzle member to be driven vertically at a higher speed in a component mounting device.

A component mounting device according to one aspect of the present disclosure is a component mounting device provided with a head unit having a first nozzle array including a plurality of nozzle members aligned in one row in a first direction, a second nozzle array that includes a plurality of nozzle members aligned in one row in the first direction and that is aligned in a second direction orthogonal to the first direction with respect to the first nozzle array, a first linear motor that vertically drives the nozzle members of the first nozzle array, and a second linear motor that vertically drives the nozzle members of the second nozzle array, the first linear motor and the second linear motor each including a linear motor main body and a frame member that supports the linear motor main body, the linear motor main body including a stationary element fixed to the frame member and a mobile element that faces the stationary element in the second direction and that is movable in a vertical direction with respect to the stationary element, the stationary element being an armature provided with a core that is aligned in the vertical direction and that has a plurality of teeth extending in the second direction, and a coil fitted to each of the respective teeth of the core, the mobile element being a field element having a plurality of permanent magnets arranged in the vertical direction such that surface polarities thereof on a side facing the stationary element differ alternately, each of the nozzle members being coupled to the mobile element, and the first linear motor and the second linear motor being mounted to the head unit such that the mobile element of the first linear motor and the mobile element of the second linear motor are in close proximity with each other in the second direction and each stationary element is located outside the mobile element.

DETAILED DESCRIPTION

One preferred embodiment of the present disclosure will be described below with reference to the accompanying drawings.

Figure 1:
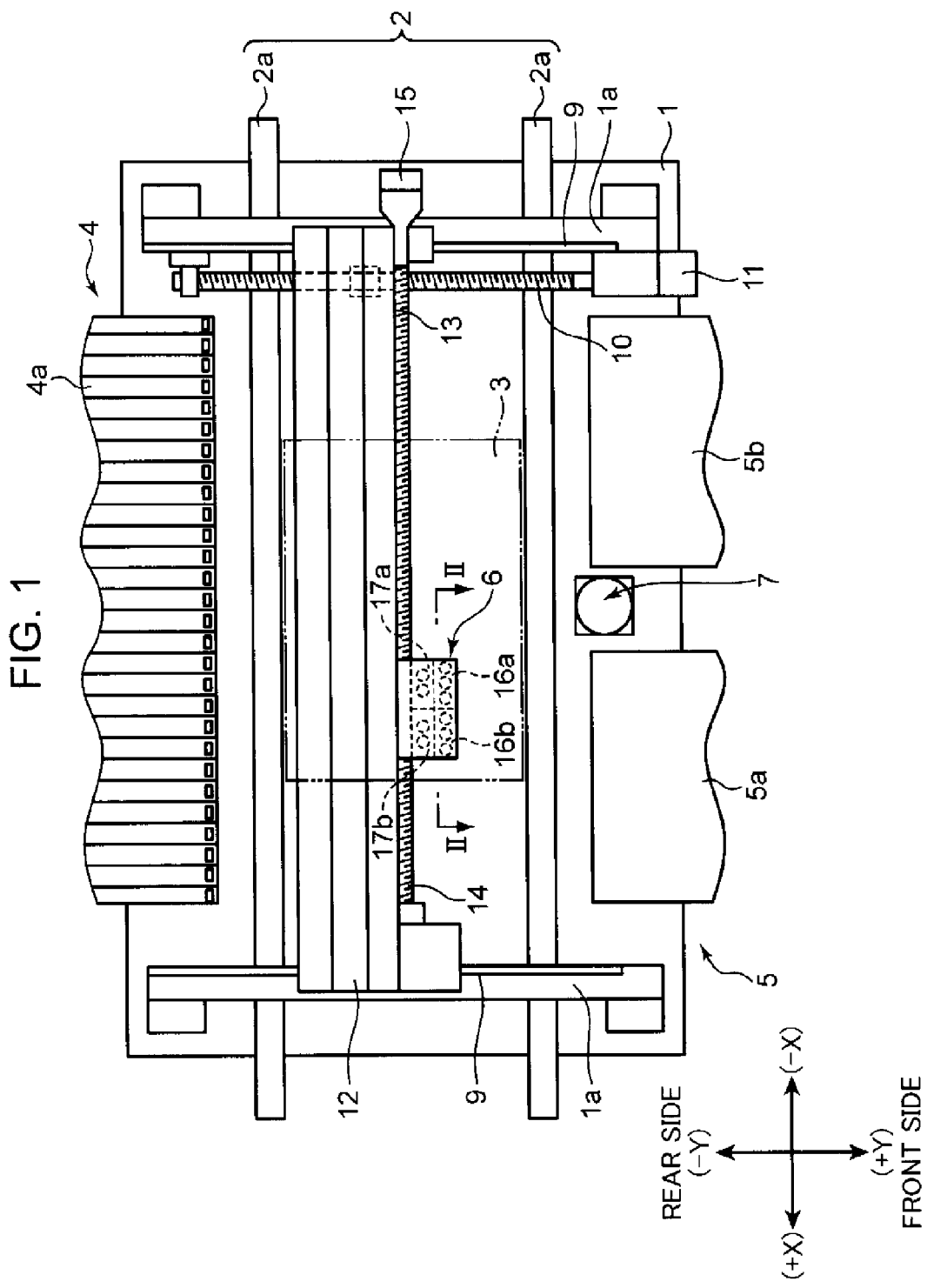
FIG. 1 is a plan view showing a component mounting device according to the present disclosure.

FIG. 1 schematically shows a component mounting device according to the present disclosure in a plan view. In the drawings illustrated in FIG. 1 and the drawings described later, rectangular coordinate axes X, Y, and Z are shown in order to clarify the directional relationships.

The component mounting device is provided with a base 1, a substrate transfer mechanism 2 that is disposed on the base 1 to transfer a substrate 3 such as a printed wiring board (PWB) in the X-direction, component supply sections 4 and 5, a head unit 6 for component mounting, a head unit driving mechanism that drives the head unit 6, an imaging unit 7 for component recognition, and the like.

The substrate transfer mechanism 2 includes a pair of conveyors 2a that transfer the substrate 3 on the base 1. With the conveyors 2a, the substrate 3 is accepted from the right side in the same drawing and transferred to a predetermined mounting work position (position shown in the same drawing). The substrate 3 is held by a holding device omitted in the drawing. After the mounting work, the conveyors 2a release hold of the substrate 3 and transfer the substrate 3 to the left side in the same drawing.

The component supply sections 4 and 5 are disposed on both sides (both sides in the Y-direction) of the substrate transfer mechanism 2. In the component supply section 4 on one side out of the component supply sections 4 and 5, a plurality of tape feeders 4a aligned in the X-direction along the substrate transfer mechanism 2 are disposed. The tape feeders 4a are provided with a reel around which a tape accommodating and holding a chip component in the shape of a small piece such as an IC, transistor, or capacitor is wound, and supply a component to a predetermined component supply position near the substrate transfer mechanism 2 while unreeling the tape intermittently from the reel. In the component supply section 5 on the other side, trays 5a and 5b are set with a predetermined interval in the X-direction. In the respective trays 5a and 5b, package-type components such as a quad flat package (QFD) or ball grid array (BGA) are each aligned and placed, such that a component can be taken out by the head unit 6 described below.

The head unit 6 with which a component is taken out from the component supply section 4 or 5 and mounted on the substrate 3 is disposed above the substrate transfer mechanism 2, the component supply sections 4 and 5, and the like.

The head unit 6 is movable in the X-direction and Y-direction within a certain region by the head unit driving mechanism. The head unit driving mechanism includes a pair of fixed rails 9 that is fixed to a pair of elevated frames 1a provided on the base 1 and that extends parallel with each other in the Y-direction, a unit support member 12 supported by the fixed rails 9 and extending in the X-direction, and a ball screw shaft 10 screwed and inserted to the unit support member 12 and driven by a Y-axis servo motor 11. The head unit driving mechanism includes a fixed rail 13 fixed to the unit support member 12 to support the head unit 6 to be movable in the X-direction and a ball screw shaft 14 screwed and inserted to the head unit 6 and driven with an X-axis servo motor 15 as a drive source. That is, the head unit driving mechanism moves the head unit 6 in the X-direction with the ball screw shaft 14 by driving of the X-axis servo motor 15, and moves the unit support member 12 in the Y-direction with the ball screw shaft 10 by driving of the Y-axis servo motor 11. As a result, the head unit driving mechanism moves the head unit 6 in the X-direction and Y-direction within the certain region.

Figure 2:
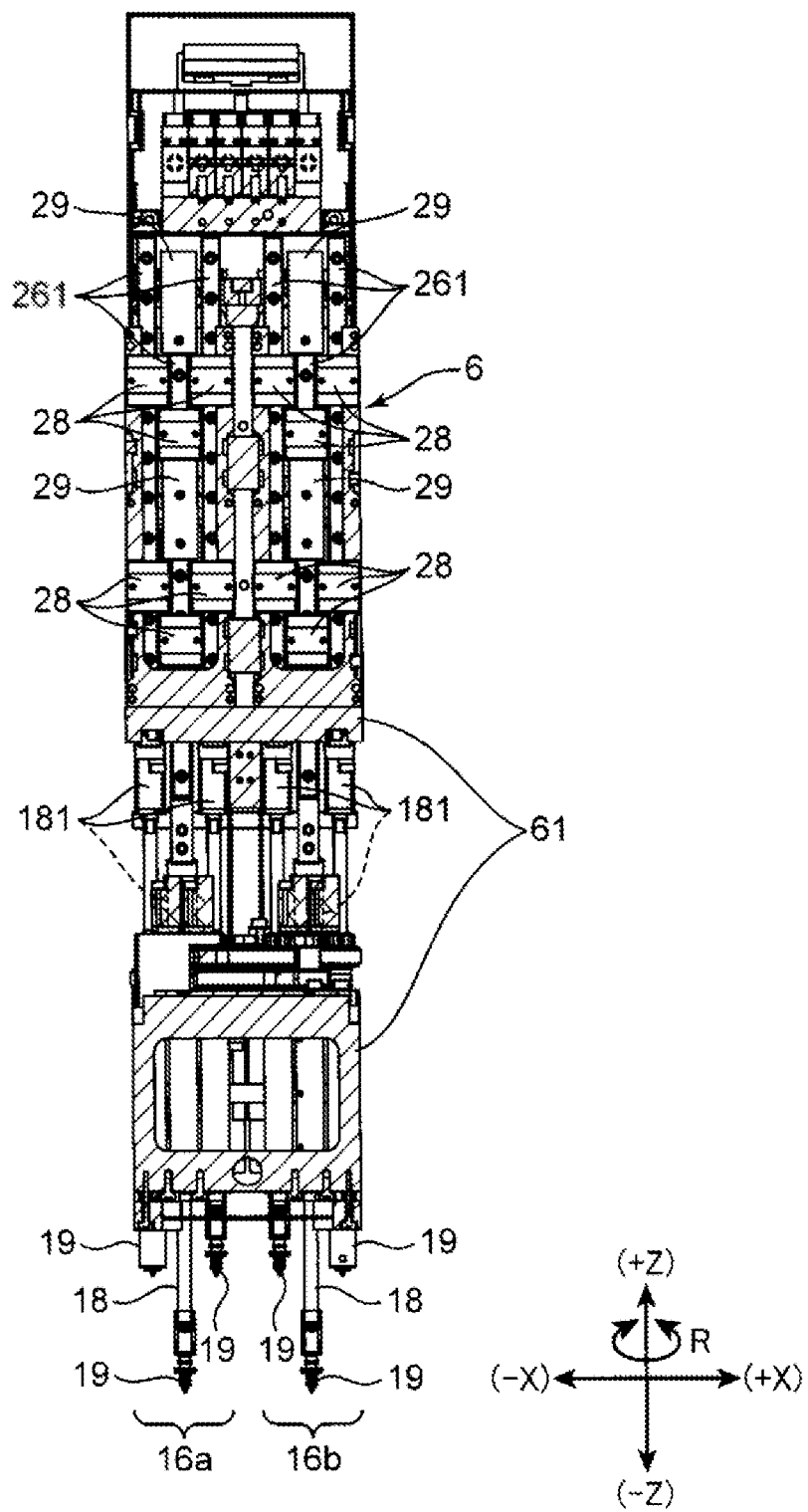
FIG. 2 is a sectional view (sectional view along line II-II in FIG. 1) showing a head unit.
Figure 3:
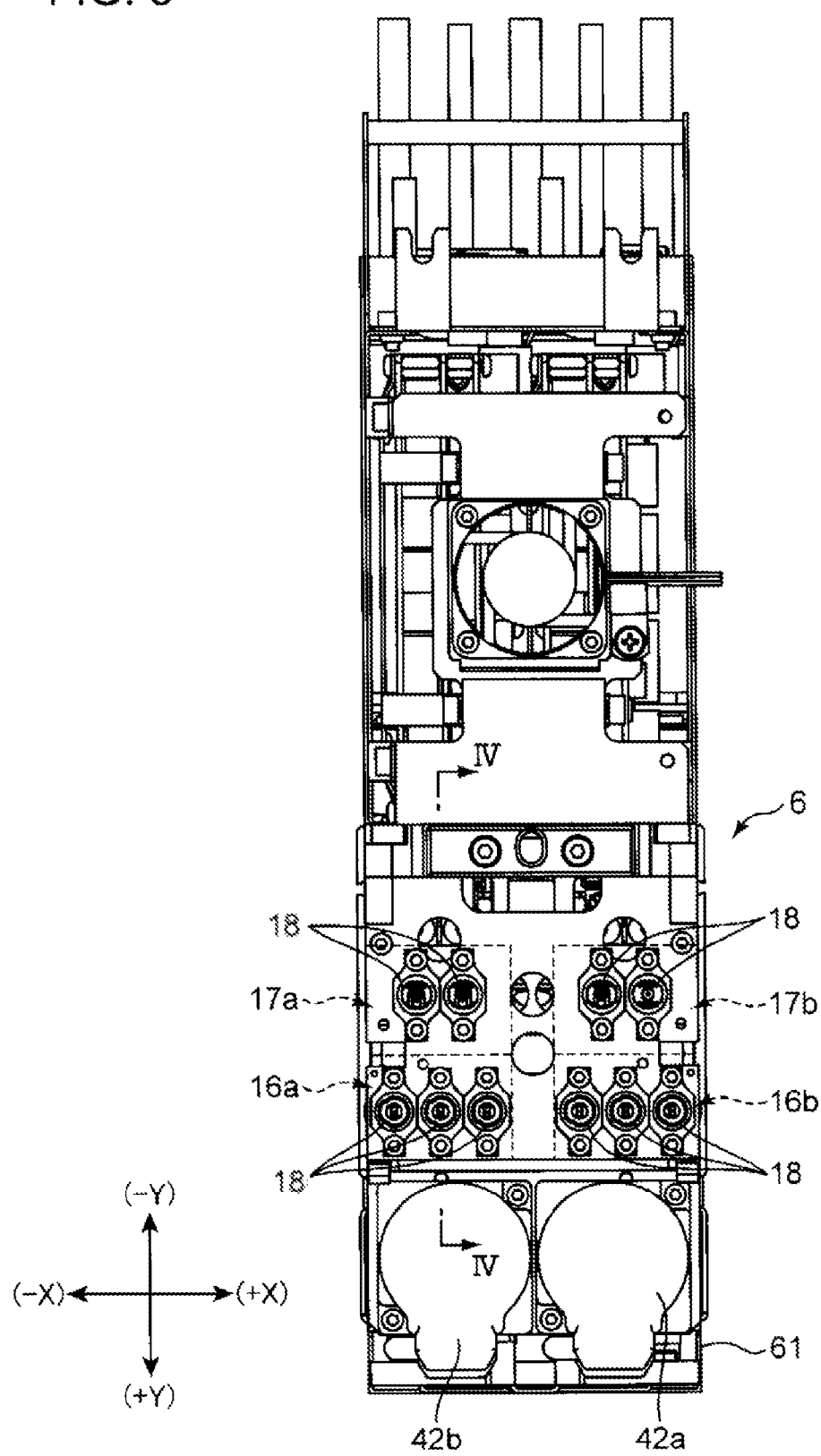
FIG. 3 is a bottom view showing the head unit.

As shown in FIG. 2 and FIG. 3, the head unit 6 is provided with two front-row heads 16a and 16b aligned along the X-direction and two rear-row heads 17a and 17b aligned along the X-direction in a similar manner behind the front-row heads 16a and 16b. The front-row heads 16a and 16b and the rear-row heads 17a and 17b, described in detail later, are both units provided with a multi-axis linear motor. The front-row heads 16a and 16b are each provided with three drive shafts 18 aligned in one row in the X-direction (corresponding to a first direction in the present disclosure) and extending in the Z-direction. The rear-row heads 17a and 17b each have two drive shafts 18 aligned in one row in the X-direction and extending in the Z-direction. Accordingly, in the head unit 6, a total of ten drive shafts 18 are provided in a state where there are two rows in the front-back direction (Y-direction corresponding to a second direction in the present disclosure), specifically, in a state where there are six in the front row and four in the rear row.

The tip end (lower end) of the respective drive shafts 18 are attached with the nozzle 19 for component suction. The respective nozzles 19 are each capable of communication with either a negative-pressure generating device, positive-pressure generating device, or atmosphere via an electrical switching valve. Accordingly, the nozzle 19 becomes capable of sucking and holding a component through supply of negative pressure to the tip end thereof, and then releases the suction state of the component through supply of positive pressure. In this example, the drive shaft 18 and the nozzle 19 correspond to a nozzle member of the present disclosure. In addition, in this example, a nozzle array formed by respective nozzles 19 (drive shafts 18) of the front-row heads 16a and 16b corresponds to a first nozzle array of the present invention, and a nozzle array formed by respective nozzles 19 (drive shafts 18) of the rear-row heads 17a and 17b corresponds to a second nozzle array of the present invention. The respective drive shafts 18 of the front-row heads 16a and 16b and the respective drive shafts 18 of the rear-row heads 17a and 17b are offset from each other in the X-direction. Accordingly, ten nozzles 19 (drive shafts 18) are arranged in a zigzag shape as a whole.

The respective nozzles 19 (drive shafts 18) are capable of vertical movement (movement in the Z-direction) with respect to the head unit 6 and rotation about the central axis (in the R-direction), and are each driven by a vertical driving mechanism and a rotation driving mechanism. Of the driving mechanisms, the vertical driving mechanism is incorporated in each of the respective heads 16a to 17b. The configuration of the respective heads 16a to 17b including the vertical driving mechanism and the configuration of the rotation driving mechanism of the nozzle 19 will be described later.

The imaging unit 7 images, prior to mounting, a component taken out from the component supply section 4 or 5 for image recognition of a state where the component is held by each nozzle 19. The imaging unit 7 is disposed in a position on the base 1 and between the trays 5a and 5b. The imaging unit 7 is disposed fixedly on the base 1, and provided with a camera (image sensor) to image a component, held by each nozzle 19, from the lower side thereof and a lighting device that gives lighting for imaging with respect to the component, so that the component held by each nozzle 19 is imaged and image data thereof is output to a control device, not shown, when the head unit 6 moves above the imaging unit 7 after suction of the component from the component supply section 4 or 5.

Next, the specific configuration of the head unit 6 and the respective heads 16a to 17b will be described.

Figure 4:
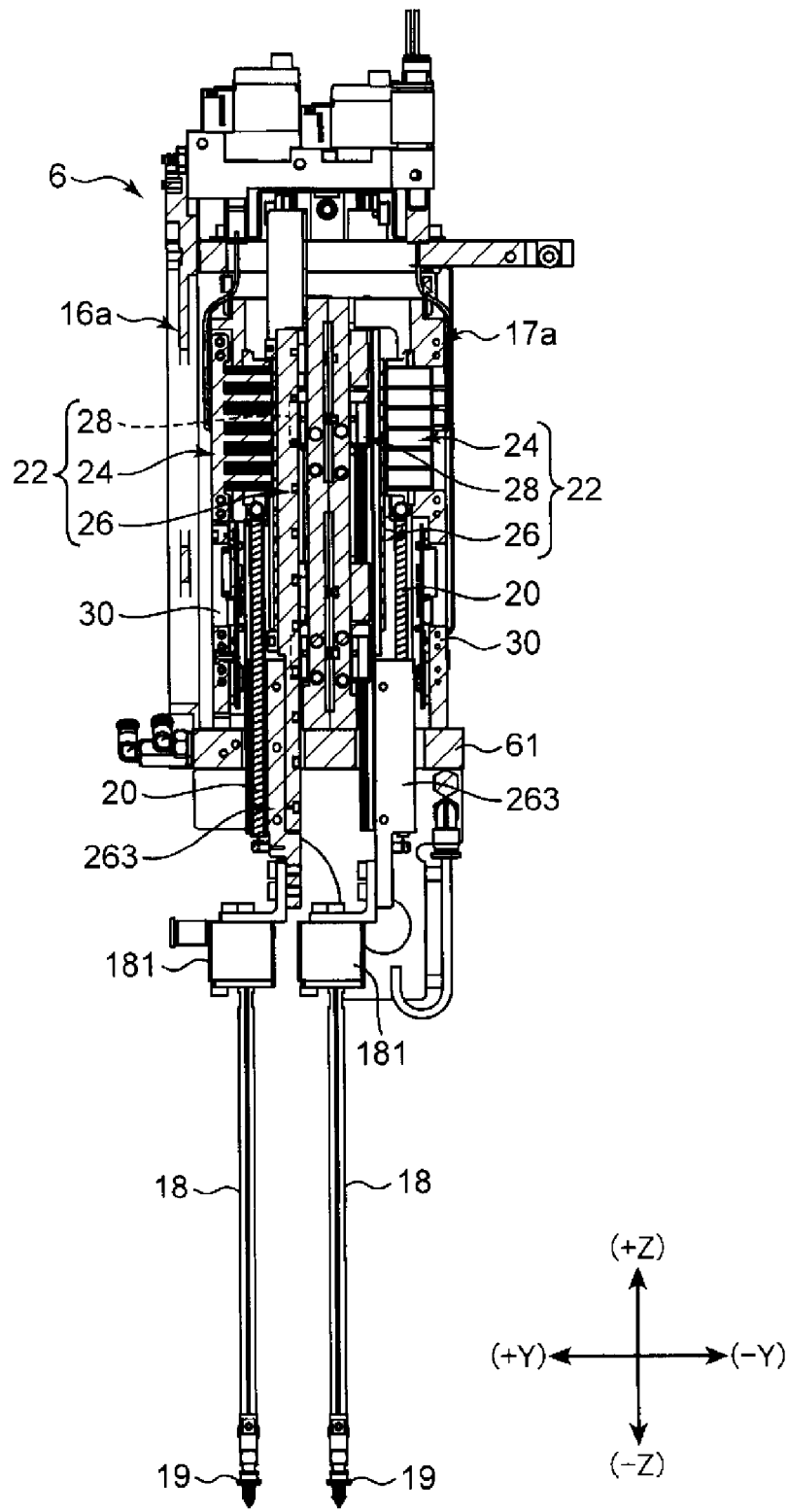
FIG. 4 is a vertical sectional view (sectional view along line IV-IV in FIG. 3) showing the head unit.

As described above, the head unit 6 is provided with a total of four heads 16a to 17b of the front-row heads 16a and 16b and the rear-row heads 17a and 17b. Of the heads 16a to 17b, as shown in FIG. 3 and FIG. 4, the heads 16a and 17a located on the right side (minus X-direction side) are adjacent to each other in the front-back direction (Y-direction). In a similar manner, the heads 16b and 17b located on the left side are adjacent in the front-back direction. In this state, the respective heads 16a to 17b are fixed to a head frame 61 of the head unit 6.

Figure 6:
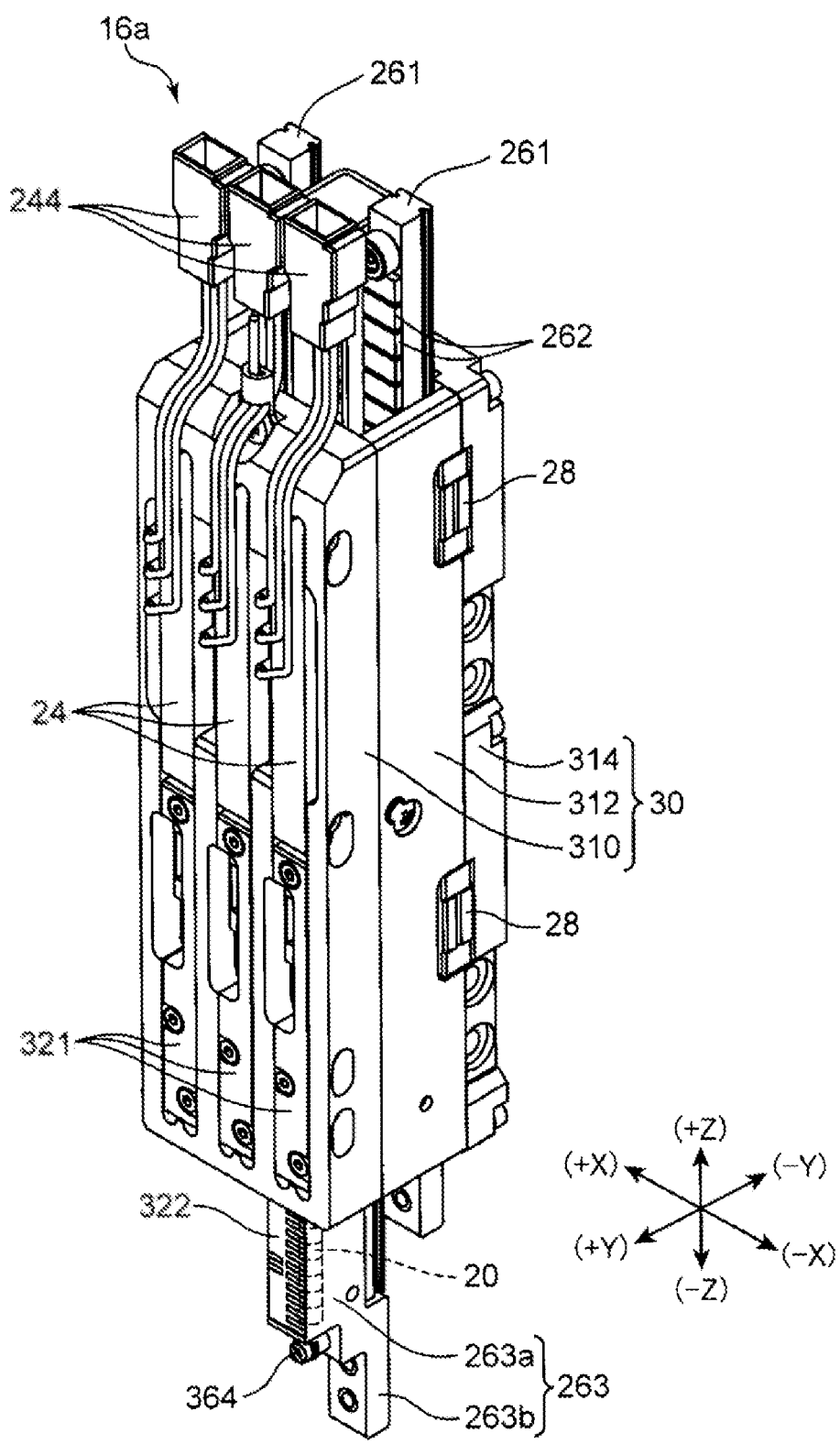
FIG. 6 is a perspective view showing the external appearance of the front-row head.
Figure 7:
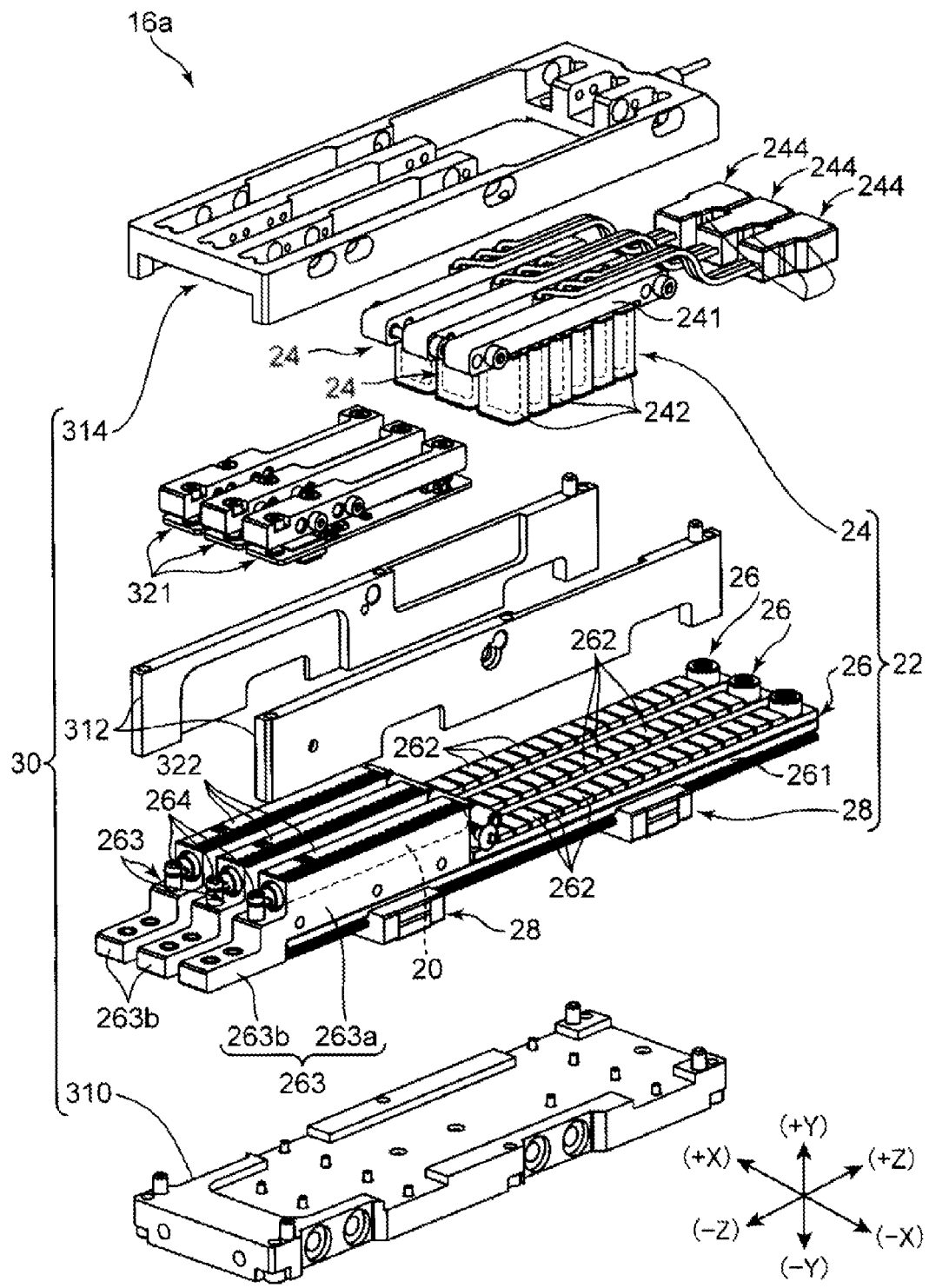
FIG. 7 is an exploded perspective view showing the configuration of the front-row head.

The configuration of the heads 16a to 17b will be described below with an example of the front-row head 16a, mainly with reference to FIG. 5 to FIG. 7.

Roughly, the front-row head 16a is provided with a multi-axis linear motor of a three-axis configuration, three of the drive shafts 18 driven vertically and independently by the multi-axis linear motor (hereinafter abbreviated simply as linear motor), the nozzle 19 attached to a lower end section of each drive shaft 18, a return spring 20, and a linear encoder 32.

The linear motor is configured from a linear motor main body 22 and a frame member 30 in which the linear motor main body 22 is incorporated. The linear motor main body 22 includes a stationary element 24, a mobile element 26, and a support member 28 that holds the mobile element 26 to be movable. The linear motor in this example (linear motor of the front-row head 16*a*) includes three linear motor main bodies 22, three linear encoders 32 each corresponding to the respective linear motor main bodies 22, and three return springs 20 each corresponding to the respective linear motor main bodies 22, and has a configuration in which these are incorporated in the common (one) frame member 30. The mobile elements 26 of the respective linear motor main bodies 22 are each coupled with the drive shaft 18. With this configuration, the respective nozzles 19 (drive shafts 18) are configured to be each driven vertically in the Z-direction by the linear motor main body 22 and, when the linear motor main body 22 is stopped, each held in predetermined upward end positions with the biasing force of the return spring 20.

To illustrate in detail, the frame member 30 has a boxed shape that penetrates in the Z-direction and that is provided with an end block 310 for which the Y-direction is the normal line direction, a pair of side plates 312 disposed on both sides of the end block 310 in the X-direction, and a front block 314 that, together with the end block 310, sandwiches the two side plates 312 in the Y-direction. The blocks 310 and 314 and the plates 312 are all formed from non-magnetic material such as aluminum alloy.

Each linear motor main body 22 includes the stationary element 24, the mobile element 26, and the support member 28, as described above. The stationary element 24 is an armature provided with a comb-shaped core 241 having, in an integrated manner, a yoke extending in the Z-direction and a plurality of teeth extending perpendicularly toward the rear side (minus Y-direction side) from a side section of the yoke and aligned in the Z-direction and a coil 242 fitted to the respective teeth of the core 241. The stationary elements 24 of the respective linear motor main bodies 22 are each fixed to the front block 314 in a state of being aligned in parallel in the X-direction. That is, the frame member 30 supports each stationary element. 24. Reference numerals 244 in FIG. 6 and FIG. 7 denote a wire for supplying driving current with respect to each of the respective stationary elements 24 (coils 242).

The mobile element 26 is provided to align horizontally in the Y-direction with respect to the stationary element 24. The mobile element 26 has a facing surface that faces the stationary element 24 and is provided with a shaft-shaped member 261 extending in the Z-direction and with a rectangular section, a plurality of permanent magnets 262 as a field element fixed to the facing surface of the shaft-shaped member 261, and an attachment block 263 to which the drive shaft 18 is attached.

The plurality of permanent magnets 262 are fixed along the Z-direction within a certain range from the upper end (end on the plus Z-direction side) of the shaft-shaped member 261, such that the polarities on the surface side (i.e., stationary element 24 side) differ alternately. On the lower side (end on the minus Z-direction side) relative to a region where the permanent magnet 262 is fixed in the shaft-shaped member 261, the attachment block 263 is attached. The attachment block 263 is a structure having, in an integrated manner, a sleeve section 263*a* with a rectangular section and a shaft attachment section 263*b* provided continuously with a lower end portion of the sleeve section 263*a*. An upper end section of the drive shaft 18 is fixed with respect to the shaft attachment section 263*b* (see FIG. 4). On the front surface at the upper end of the shaft attachment section 263*b*, a stud pin 264 that protrudes forward along the Y-direction is provided upright, and one end section of the return spring 20 is attached to the stud pin 264. The return spring 20 is passed through inside the sleeve section 263*a*, and the other end section is brought above the sleeve section 263*a*.

The mobile elements 26 of the respective linear motor main body 22 are aligned in parallel in the X-direction, and are each disposed such that the field element (permanent magnet 262) faces the armature (stationary element 24) in the Y-direction, specifically, such that a predetermined gap is formed between the stationary element 24 and the mobile element 26 (more accurately, between a mobile element-side end section of the comb-shaped core 241 and the stationary element-side surface of the permanent magnet 262). The respective mobile elements 26 are fitted to be slidable in the longitudinal direction (longitudinal direction of the shaft-shaped member 261 that is the Z-direction) to the plurality of support members 28 fixed to the end block 310. That is, the respective support members 28 are attached to the frame member for each linear motor main body 22 and support the respective mobile elements 26 to be each movable independently in the vertical direction. In FIG. 7, only the support member 28 that holds the mobile element 26 located on the nearest side (minus X-direction side) is shown, and others are omitted. The other end section of the return spring 20 is attached to the front block 314 with a bolt, omitted in the drawing. Accordingly, when a predetermined drive current is given to the stationary element 24 (armature) of each linear motor main body 22 from a control device, not shown, specifically, when three-phase currents with differing phases are given to the respective coils 242, a magnetic field is created at the respective coils 242, a thrust that moves the mobile element 26 in the Z-direction is generated between the stationary element 24 and the mobile element 26, and the thrust moves the mobile element 26 (drive shaft 18) in the Z-direction with respect to the frame member 30. When current supply with respect to each coil 242 is interrupted, the shaft-shaped member 261 is biased upward along the Z-axis by the elastic force of the return spring 20, and, as a result, the mobile element 26 (drive shaft 18) of each linear motor main body 22 is held in the upper end position in the movable region thereof.

As shown schematically in FIG. 2 (while omitted in FIG. 7), the front-row head 16*a* is further provided with a shield member 29 fixed to the frame member 30 (end block 310). The shield member 29 is for preventing negative influence of a mutual action between the adjacent linear motor main bodies 22, e.g., the mobile elements 26 moving together, is a member with a U-shaped sectional surface provided with a shield wall each interposed between the adjacent mobile elements 26, and is formed from a magnetic body entirely.

The shaft-shaped member 261 and the support member 28 are configured of a guide device that is a so-called linear guide provided with a rail member and a slider fitted to the rail member to be movable. That is, the shaft-shaped member 261 of the mobile element 26 is configured of the rail member of the guide device, and the support member 28 is configured of the slider. With this configuration, each linear motor main body 22 is configured to enable the mobile element 26 (drive shaft 18) to move in the Z-direction stably and smoothly. The shaft-shaped member 261 (rail member) is configured from magnetic material. Accordingly, in the linear motor, the configuration is such that the shaft-shaped member 261 also acts as a back yoke of the field element (permanent magnet 262). As shown in FIG. 2, the support members 28 of the respective linear motor main bodies 22 are disposed in a zigzag shape in which the support members 28 of the adjacent linear motor main bodies 22 are vertically displaced. Accordingly, the stationary elements 24 and the mobile elements 26 of the adjacent linear motor main bodies 22 are disposed closer in the X-direction.

The linear encoder 32 is for detecting the position, in the Z-direction, of the mobile element 26 of the linear motor main body 22. The linear encoder 32 includes a sensor substrate 321 provided with a magnetic sensor such as an MR sensor or hall sensor and a plate-shaped magnetic scale 322 in which magnetic scales readable by the magnetic sensor are recorded. The linear encoder 32 is provided to correspond to each linear motor main body 22. Specifically, as shown in FIG. 7, three sensor substrates 321 each located on the lower side (minus Z-direction side) of the respective stationary elements 24 are fixed to the front block 314 in a state of being aligned in parallel. Flat attachment surfaces are each formed on the front side of the attachment blocks 263 (sleeve sections 263a) of the respective mobile elements 26, and the magnetic scales 322 are each fixed to the respective attachment surfaces. Accordingly, at the time of driving of the linear motor, the magnetic sensors of the respective sensor substrates 321 each read the corresponding magnetic scales 322, so that the position of each mobile element 26 is controlled by a control device, not shown.

The configuration of the front-row head 16a located on the right side in the head unit 6 has been described. The front-row head 16b located on the left side has the same configuration. Aside from the number of the linear motor main bodies 22 being two, the rear-row heads 17a and 17b also have the same configuration as the front-row head 16a. In this embodiment, the frame member 30 of each linear motor of the front-row heads 16a and 16b corresponds to a first frame member of the present disclosure, and a frame member of each linear motor of the rear-row heads 17a and 17b corresponds to a second frame member of the present disclosure.

Figure 5:
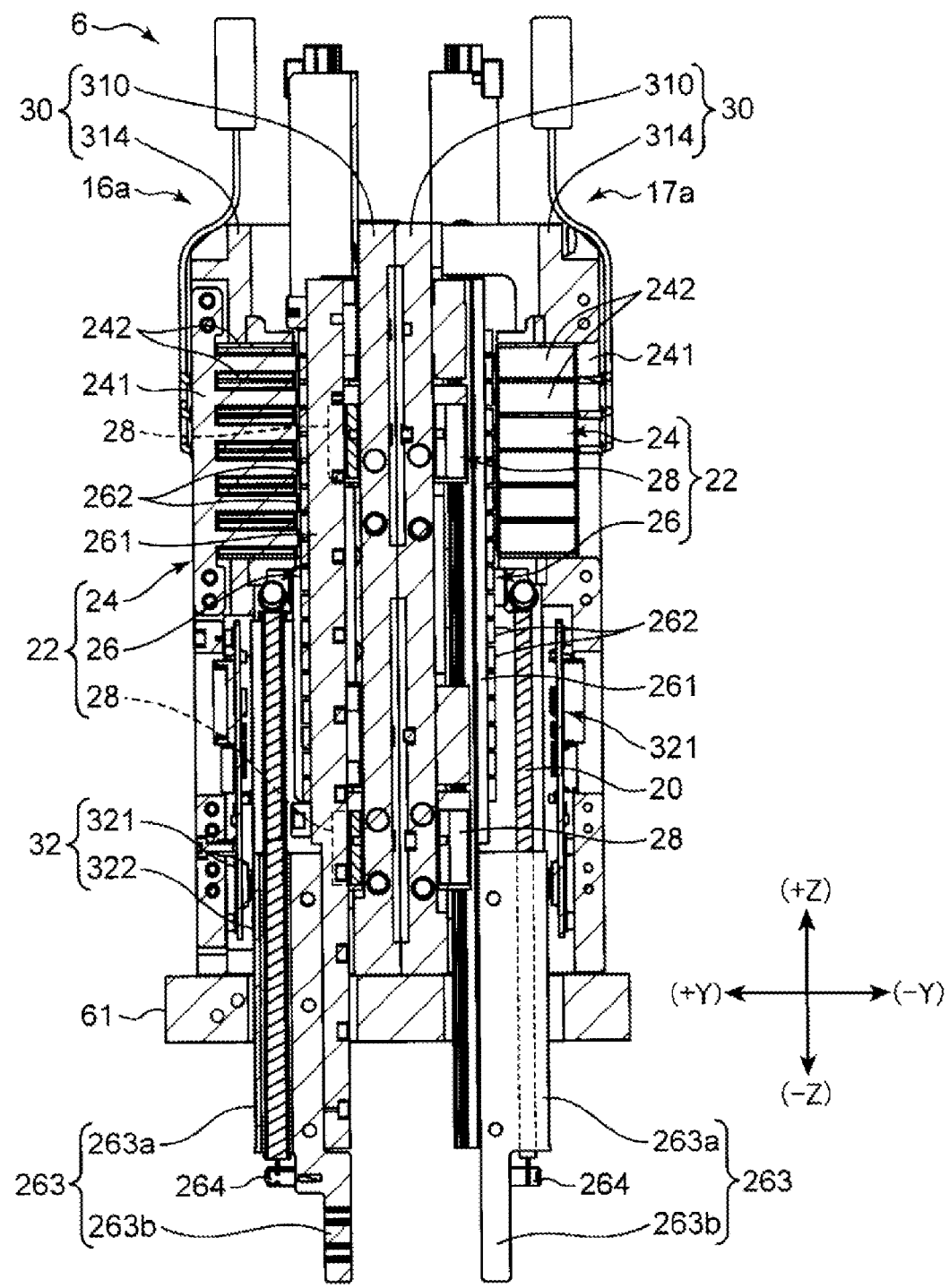
FIG. 5 is an enlarged view of a main section in FIG. 4 showing the configuration of a front-row head and a rear-row head mounted to the head unit.

As shown in FIG. 5, the front-row heads 16a and 16b and the rear-row heads 17a and 17b are fixed to the head frame 61 of the head unit 6 in a state where the end blocks 310 of the frame members 30 are disposed back to back to be in contact. That is, the front-row heads 16a and 16b and the rear-row heads 17a and 17b are fixed to the head frame 61 in a state where the mobile elements 26 of the linear motor main bodies 22 are in close proximity and the stationary element 24 is located outside the mobile element 26. In this example, the linear motor of the heads 16a and 16b corresponds to a first linear motor of the present disclosure, and the linear motor of the heads 17a and 17b corresponds to a second linear motor of the present disclosure.

The front-row heads 16a and 16b and the rear-row heads 17a and 17b have a configuration in which the respective linear motor main bodies 22 of the front-row heads 16a and 16b and the respective linear motor main bodies 22 of the rear-row heads 17a and 17b are offset in the X-direction, such that the front and rear nozzles 19 (drive shafts 18) align alternately when the head unit 6 is seen from the front (seen from the plus Y-direction side). Accordingly, a total of ten nozzles 19 (drive shafts 18) coupled to the respective linear motor main bodies 22 are arranged in a zigzag shape as a whole, as described above.

The rotation driving mechanism is configured as follows. That is, as shown in FIG. 4, the drive shaft 18 of the respective heads 16a to 17b is assembled to the attachment block 263 of the mobile element 26 with a shaft holding member 181 therebetween that holds the drive shaft 18 to be rotatable about the central axis thereof (in the R-direction). In a state where movement in the Z-direction and rotation about the central axis (in the R-direction) are each made possible, a middle portion in the longitudinal direction of the drive shaft 18 of the respective heads 16a to 17b is held by a holding section, not shown, of the head frame 61. A drive belt is hung in a predetermined order over a drive pulley fitted to two R-axis servo motors 42a and 42b (shown in FIG. 3), that are fixed to the head frame 61 and a driven pulley, not shown, splined and fitted to each drive shaft 18. Accordingly, the nozzles 19 (drive shafts 18) of the heads 16a to 17b are rotated and driven integrally for each specific group.

In the component mounting device described above, mounting of a component is performed as follows.

First, the head unit 6 moves to the component supply section 4 or 5, and suction of a component is performed by each nozzle 19. Specifically, after a predetermined nozzle 19 is disposed above the tape feeder 4a, for example, the drive shaft 18 is driven vertically by the linear motor. Accordingly, the nozzle 19 descends to take out the component within the tape in a sucked state. At this time, suction of components is performed simultaneously by a plurality of the nozzles 19, in cases where it is possible. When suction of the component is complete, the head unit 6 moves along a predetermined route above the component imaging unit 7 and onto the substrate 3. During this movement, a correction amount for mounting is calculated by a control device, not shown, through image recognition of a state where the component is sucked by each nozzle 19, and the drive shaft 18 is rotated by the R-axis servo motor 42a or 42b so that the direction of the sucked component is at a predetermined angle. When the head unit 6 reaches a first mounting position (mounting position in consideration of the correction amount) of the substrate 3, the drive shaft 18 is driven vertically by the linear motor to mount the component to the substrate 3. Thereafter, the head unit 6 moves sequentially to mounting positions to mount the remaining sucked components onto the substrate 3.

With the component mounting device described above, the linear motor (linear motor main body 22) that vertically drives each nozzle 19 (drive shaft 18) is a so-called cored linear motor in which the armature (stationary element 24) is configured from the core 241 and the coil 242 fitted thereto. Therefore, great thrust, i.e., vertical drive force of the nozzle 19, can be obtained even with a compact configuration provided with a relatively small armature (stationary element). Moreover, since the configuration of the linear motor (linear motor main body 22) is such that the stationary element 24 and the mobile element 26 align in the Y-direction, it is possible to reduce the space occupied in the X-direction. Thus, for the respective heads 16a to 17b, the respective nozzles 19 (drive shafts 18) can be arranged with a narrow pitch in the X-direction. Further, since the front-row heads 16a and 16b and the rear-row heads 17a and 17b are disposed such that the mobile elements 26 of the linear motor main bodies 22 are in close proximity and the stationary element 24 is located outside the mobile element 26, the nozzle 19 in the front row and the nozzle 19 in the rear row can be arranged with a narrow pitch in the Y-direction. Particularly, the mobile element 26 of the linear motor (linear motor main body 22) is of a configuration in which the permanent magnet 262 is stacked on the shaft-shaped member 261, and is movably supported directly to the frame member 30 by the support member 28. Therefore, the dimension from the surface (surface facing the stationary element) of the mobile element 26 to the bottom surface (fixed surface facing the end block 310) of the support member 28 is extremely small. In this regard as well, the nozzle 19 in the front row and the nozzle 19 in the rear row can be arranged with a narrow pitch in the Y-direction.

Thus, with this component mounting device, the nozzle 19 (drive shaft 18) can be driven vertically at a higher speed and narrowing of the pitch of arrangement of the nozzle members or size reduction of the head unit can be achieved effectively, compared to a conventional component mounting device of this type (described in Japanese Patent No. 4208155).

By the shaft-shaped member 261 being configured from magnetic material as described above in the linear motor, the configuration is such that the shaft-shaped member 261 also acts as a back yoke of the field element (permanent magnet 262). With the configuration of this linear motor, the dimension from the surface (surface facing the stationary element) of the mobile element 26 to the bottom surface (fixed surface facing the end block 310) of the support member 28 is reduced, compared to a configuration in which a dedicated back yoke is provided separately. Thus, in this regard as well, the nozzles 19 of the front-row heads 16a and 16b and the respective nozzles 19 of the rear-row heads 17a and 17b can be arranged with a narrow pitch in the Y-direction.

The linear motor is a multi-axis linear motor with a configuration in which three (or two) linear motor main bodies 22 each configured from the stationary element 24, the mobile element 26, and the support member 28 are incorporated integrally in a state of being aligned in parallel inside the (one) common hollow-box-shaped frame member 30. That is, the stationary elements 24 and the support members 28 of the respective linear motor main body 22 are each fixed and supported on the common frame member 30. With such a configuration, space occupied by the frame member 30 can be reduced and the entire linear motor is accordingly made compact in the aligned direction of the linear motor main bodies 22, compared to a configuration in which a plurality of linear motors structured independently from each other are aligned, i.e., configuration in which the linear motor main bodies 22 are separated completely with a frame or the like. Thus, in this manner, the size of the head unit 6 can be reduced in correspondence with the linear motor being made compact.

With the component mounting device described above, the front-row heads 16a and 16b and the rear-row heads 17a and 17b are disposed such that the mobile elements 26 of the linear motor main bodies 22 are in close proximity and the stationary element 24 is located outside the mobile element 26. That is, the front and rear linear motors are disposed such that the stationary elements 24 (armatures) that generate heat due to copper loss are apart. Therefore, thermal deformation of a specific portion of the head frame 61 is effectively prevented. Thus, with this component mounting device, there is also an advantage that it is possible to prevent occurrence of a drive error of the nozzle 19 (drive shaft 18) caused by the thermal deformation in advance and perform component mounting with high precision.

The component mounting device described above is shown as an example of a preferred embodiment for the component mounting device according to the present disclosure. The specific configuration thereof is appropriately changeable without departing from the gist of the present disclosure.

For example, in the embodiment, the configuration of the head unit 6 is such that the nozzle 19 (drive shaft 18) is driven by the multi-axis linear motor of the three-axis (or two-axis) configuration, i.e., the linear motor in which three (or two) linear motor main bodies 22 are incorporated in the common (one) frame member 30. However, obviously, the configuration may be such that the nozzle 19 (drive shaft 18) is driven by a single-axis linear motor, i.e., a linear motor in which one linear motor main body 22 is incorporated in one frame member.

In the embodiment, the respective nozzles 19 (drive shafts 18) of the front-row heads 16a and 16b and the nozzles 19 (drive shafts 18) of the rear-row heads 17a and 17b are offset in the X-direction. However, obviously, the configuration may be such that the front and rear nozzles 19 align in the Y-direction in the same position in the X-direction. Note that, with the configuration in which the nozzle 19 in the front row and the nozzle 19 in the rear row are offset in the X-direction as in the embodiment, i.e., configuration in which the linear motor main body 22 in the front row and the linear motor main body 22 in the rear row are offset in the X-direction as described above, the stationary elements 24 (armatures) of the front and rear linear motors can be farther apart, compared to the configuration in which the front and rear linear motor main bodies 22 align in the Y-direction in the same position in the X-direction. Thus, in terms of preventing thermal deformation of the head frame 61, the configuration in which the nozzle 19 in the front row and the nozzle 19 in the rear row are offset in the X-direction as in the embodiment is advantageous.

In the linear motor of the embodiment, the shaft-shaped member 261 is configured to also acts as a back yoke of the field element (permanent magnet 262) by the shaft-shaped member 261 being configured from magnetic material. However, obviously, a dedicated back yoke may be interposed between the shaft-shaped member 261 and the permanent magnet 262.

In the linear motor of the embodiment, each stationary element 24 and each support member 28 configured of the slider are fixed and supported directly on the frame member 30. However, fixation and support on the frame member 30 may be with an intermediate object therebetween.

The present disclosure described above is summarized as follows.

A component mounting device according to one aspect of the present disclosure is provided with a head unit having a first nozzle array including a plurality of nozzle members aligned in one row in a first direction, a second nozzle array that includes a plurality of nozzle members aligned in one row in the first direction and that is aligned in a second direction orthogonal to the first direction with respect to the first nozzle array. A first linear motor vertically drives the nozzle members of the first nozzle array. A second linear motor vertically drives the nozzle members of the second nozzle array. The first linear motor and the second linear motor each including a linear motor main body. A frame member supports the linear motor main body. The linear motor main body including a stationary element fixed to the frame member and a mobile element that faces the stationary element in the second direction and that is movable in a vertical direction with respect to the stationary element. The stationary element being an armature provided with a core that is aligned in the vertical direction and that has a plurality of teeth each in the second direction, and a coil fitted to each of the respective teeth of the core. The mobile element being a field element having a plurality of permanent magnets arranged in the vertical direction such that surface polarities thereof on a side facing the stationary element differ alternately. Each of the nozzle members being coupled to the mobile element. The first linear motor and the second linear motor being mounted to the head unit such that the mobile element of the first linear motor and the mobile element of the second linear motor are in close proximity with each other in the second direction. Each stationary element is located outside the mobile element.

In the component mounting device, the first linear motor and the second linear motor that drive the nozzle member is a so-called cored linear motor in which the armature (stationary element) is configured from the core and the coil. Therefore, it is possible to obtain relatively great thrust, i.e., drive force of the nozzle member, even with a compact configuration provided with the small armature (stationary element). Moreover, since the configuration of the first linear motor and the second linear motor is such that the mobile element and the stationary element align in the second direction, it is possible to reduce space occupied in the first direction. Thus, it is possible to arrange the nozzle member in each nozzle array with a narrow pitch in the first direction. Since the first linear motor and the second linear motor are disposed such that the mobile elements to which the nozzle members are coupled are in close proximity in the second direction, it is possible to arrange the nozzle members with a narrow pitch also between the nozzle arrays (i.e., in the second direction).

In the component mounting device, the linear motor main body includes a support member that is attached to the frame member to support the mobile element to be movable in the vertical direction, and the mobile element includes a shaft-shaped member having a facing surface that extends in the vertical direction to face the stationary element and movably supported to the support member, such that the plurality of permanent magnets are fixed to the facing surface of the shaft-shaped member.

Regarding the first linear motor and the second linear motor, the dimension from the surface (surface facing the stationary element) of the mobile element to the bottom surface (fixed surface facing the frame member) of the support member can be reduced with this configuration. Therefore, it is possible to arrange the nozzle members with a narrow pitch in the second direction between the nozzle arrays.

In the component mounting device described above, it is preferable that the first linear motor have a plurality of the linear motor main bodies disposed in parallel in the first direction, and one first frame member that is the frame member with which the plurality of linear motor main bodies are supported integrally, and the second linear motor have a plurality of the linear motor main bodies disposed in parallel in the first direction, and one second frame member that is the frame member with which the plurality of linear motor main bodies are supported integrally.

In brief, the frame member of the plurality of linear motors that respectively drive the plurality of nozzle members is made common for each nozzle array in this configuration. With this configuration, it is possible to reduce space occupied by the frame member and reduce the size of the head unit.

In the component mounting device described above, it is preferable that the linear motor main body of the first linear motor and the linear motor main body of the second linear motor be offset from each other in the first direction.

With this configuration, the stationary elements (armatures) can be farther apart compared to a configuration in which the linear motor main body of the first linear motor and the linear motor main body of the second linear motor align in the second direction, and it is advantageous in reducing thermal deformation of the frame member.

INDUSTRIAL APPLICABILITY

As described above, the present disclosure relates to a component mounting device, contributes to narrowing of the pitch of arrangement of nozzle members or size reduction of a head unit while enabling a nozzle member to be driven vertically at a higher speed, and thus is useful in the field of manufacturing a component mounting device in which a plurality of nozzle members are mounted to a head unit.

The invention claimed is:

1. A component mounting device comprising:
a head unit having a first nozzle array including a plurality of nozzle members aligned in one row in a first direction, a second nozzle array that includes a plurality of nozzle members aligned in one row in the first direction and that is aligned in a second direction orthogonal to the first direction with respect to the first nozzle array, a first linear motor that vertically drives the nozzle members of the first nozzle array, and a second linear motor that vertically drives the nozzle members of the second nozzle array,
the first linear motor and the second linear motor each including a linear motor main body and a frame member that supports the linear motor main body,
the linear motor main body including a stationary element fixed to the frame member and a mobile element that faces the stationary element in the second direction and that is movable in a vertical direction with respect to the stationary element,
the stationary element being an armature provided with a core that is aligned in the vertical direction and that has a plurality of teeth extending in the second direction, and a coil fitted to each of the respective teeth of the core,
the mobile element being a field element having a plurality of permanent magnets arranged in the vertical direction such that surface polarities thereof on a side facing the stationary element differ alternately,
each of the nozzle members being coupled to the mobile element, and
the first linear motor and the second linear motor each including a linear encoder that detects a position, in the vertical direction, of the mobile element of the linear motor main body, and being mounted on the head unit such that the mobile element of the first linear motor and the mobile element of the second linear motor are in close proximity with each other in the second direction, and each stationary element and each linear encoder being located outside the mobile element.

2. The component mounting device according to claim 1, wherein the linear motor main body includes a support member that is attached to the frame member to support the mobile element to be movable in the vertical direction, and
the mobile element includes a shaft-shaped member having a facing surface that extends in the vertical direction to face the stationary element and movably supported to the support member such that the plurality of permanent magnets are fixed to the facing surface of the shaft-shaped member, and
the linear encoder includes a magnetic scale fixed to a same side of the mobile element as the facing surface, and a magnetic sensor that is provided on the frame member so as to align in the vertical direction with respect to the mobile element and reads the magnetic scale.

3. The component mounting device according to claim 1, wherein the first linear motor has a plurality of the linear motor main bodies disposed in parallel in the first direction, a plurality of the linear encoders respectively corresponding to the plurality of linear motor main bodies, and a first frame member that is the frame member with which the plurality of linear motor main bodies and the plurality of linear encoders are supported integrally, and
the second linear motor has a plurality of the linear motor main bodies disposed in parallel in the first direction, a plurality of the linear encoders respectively corresponding to the plurality of linear motor main bodies, and a second frame member that is the frame member with which the plurality of linear motor main bodies and the plurality of linear encoders are supported integrally.

4. The component mounting device according to claim 1, wherein the linear motor main body of the first linear motor and the linear motor main body of the second linear motor are offset from each other in the first direction.

* * * * *